(12) United States Patent
Ueda et al.

(10) Patent No.: US 10,290,560 B2
(45) Date of Patent: May 14, 2019

(54) SEMICONDUCTOR DEVICE

(71) Applicant: Panasonic Intellectual Property Management Co., Ltd., Osaka (JP)

(72) Inventors: Naoto Ueda, Hyogo (JP); Kouji Oomori, Shiga (JP); Takayuki Yoshida, Shiga (JP); Takuma Motofuji, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/517,338

(22) PCT Filed: Aug. 5, 2015

(86) PCT No.: PCT/JP2015/003933
§ 371 (c)(1),
(2) Date: Apr. 6, 2017

(87) PCT Pub. No.: WO2016/103536
PCT Pub. Date: Jun. 30, 2016

(65) Prior Publication Data
US 2017/0301604 A1    Oct. 19, 2017

Related U.S. Application Data

(60) Provisional application No. 62/096,997, filed on Dec. 26, 2014.

(51) Int. Cl.
*H01S 5/024* (2006.01)
*H01L 23/373* (2006.01)
(Continued)

(52) U.S. Cl.
CPC .......... *H01L 23/3731* (2013.01); *H01L 23/06* (2013.01); *H01L 23/13* (2013.01);
(Continued)

(58) Field of Classification Search
CPC ..... H01L 23/3731; H01L 24/16; H01L 24/13; H01L 23/4006; H01L 23/3736;
(Continued)

(56) References Cited

U.S. PATENT DOCUMENTS 5,929,521 A * 7/1999 Wark ................. G01R 1/06738
257/692
2002/0181523 A1   12/2002 Pinneo et al.
(Continued)

FOREIGN PATENT DOCUMENTS

EP         2 665 095       11/2013
GB         1024633          3/1966
(Continued)

OTHER PUBLICATIONS

International Search Report dated Oct. 20, 2015 in International Application No. PCT/JP2015/003933.
(Continued)

*Primary Examiner* — Xinning (Tom) Niu
(74) *Attorney, Agent, or Firm* — Wenderoth, Lind & Ponack, L.L.P.

(57) ABSTRACT

A semiconductor device according to the present disclosure includes an electrically conductive first electrode block, an electrically conductive submount, an insulating layer, a semiconductor element, an electrically conductive bump, and an electrically conductive second electrode block. The submount is provided in a first region of the upper surface of the first electrode block, and electrically connected to the first electrode block. The semiconductor element is provided on the submount, and has a first electrode electrically connected to the submount. The bump is provided on the upper surface of a second electrode, opposite the first electrode, of the semiconductor element, and electrically connected to the second electrode. A third region of the
(Continued)

lower surface of the second electrode block is electrically connected to the bump via an electrically conductive metal layer. An electrically conductive metal sheet is provided between the metal layer and the bump.

17 Claims, 14 Drawing Sheets

(51) Int. Cl.
| | |
|---|---|
| *H01L 23/36* | (2006.01) |
| *H01L 23/48* | (2006.01) |
| *H01L 25/07* | (2006.01) |
| *H01L 25/18* | (2006.01) |
| *H01S 5/042* | (2006.01) |
| *H01L 23/06* | (2006.01) |
| *H01L 23/13* | (2006.01) |
| *H01L 23/14* | (2006.01) |
| *H01L 23/40* | (2006.01) |
| *H01L 23/00* | (2006.01) |
| *H01S 5/022* | (2006.01) |
| *H01L 29/861* | (2006.01) |

(52) U.S. Cl.
CPC ............ *H01L 23/142* (2013.01); *H01L 23/36* (2013.01); *H01L 23/3736* (2013.01); *H01L 23/4006* (2013.01); *H01L 23/48* (2013.01); *H01L 24/13* (2013.01); *H01L 24/16* (2013.01); *H01L 25/07* (2013.01); *H01L 25/18* (2013.01); *H01S 5/024* (2013.01); *H01S 5/02236* (2013.01); *H01S 5/042* (2013.01); *H01S 5/0425* (2013.01); *H01L 29/861* (2013.01); *H01L 2023/4043* (2013.01); *H01L 2023/4068* (2013.01); *H01L 2224/13144* (2013.01); *H01L 2224/16245* (2013.01); *H01L 2924/0002* (2013.01); *H01L 2924/1203* (2013.01); *H01L 2924/12042* (2013.01); *H01L 2924/15153* (2013.01); *H01L 2924/16235* (2013.01); *H01L 2924/16251* (2013.01)

(58) Field of Classification Search
CPC ....... H01L 23/06; H01L 23/142; H01L 23/13; H01L 2924/16251; H01L 2924/15153; H01L 2924/12042; H01L 2924/1203; H01S 5/0425; H01S 5/02236
See application file for complete search history.

(56) References Cited

U.S. PATENT DOCUMENTS

| | | | |
|---|---|---|---|
| 2006/0029117 A1 | 2/2006 | Valiente | |
| 2009/0111206 A1* | 4/2009 | Luch | H01L 31/02008 438/59 |
| 2011/0233759 A1 | 9/2011 | Shiga | |
| 2013/0058367 A1 | 3/2013 | Grove | |
| 2013/0069218 A1* | 3/2013 | Seah | H01L 23/13 257/712 |
| 2014/0042616 A1* | 2/2014 | Murayama | H01L 24/16 257/737 |
| 2014/0362577 A1 | 12/2014 | Ide et al. | |

FOREIGN PATENT DOCUMENTS

| | | | |
|---|---|---|---|
| JP | 2003-86883 | 3/2003 | |
| JP | 200386883 | * 3/2003 | ............. H01S 5/024 |
| JP | 2006-303100 | 11/2006 | |
| JP | 2008-283064 | 11/2008 | |
| JP | 2011-199162 | 10/2011 | |
| JP | 2011-199165 | 10/2011 | |
| JP | 2014-36165 | 2/2014 | |
| WO | 2010/131498 | 11/2010 | |
| WO | 2013/069743 | 5/2013 | |

OTHER PUBLICATIONS

Extended European Search Report dated Dec. 4, 2017 in European Patent Application No. 15872119.1.
English translation of Chinese Search Report dated Aug. 28, 2018 in corresponding Chinese Patent Application No. 201580053494.2.

* cited by examiner

SEMICONDUCTOR DEVICE

This application is a U.S. national stage application of the PCT International Application No. PCT/JP2015/003933 filed on Aug. 5, 2015, which claims the benefit of priority of U.S. patent application 62/096,997 filed on Dec. 26, 2014, the contents all of which are incorporated herein by reference.

TECHNICAL FIELD

The present disclosure relates to a semiconductor device, and in particular to a semiconductor device mounted with a semiconductor element that generates much heat.

BACKGROUND ART

In recent semiconductor devices including a power semiconductor element or a semiconductor laser element, a larger electric current flows through the semiconductor element, and the amount of heat generated from the semiconductor element is increased accordingly. For example, in a high-power semiconductor laser device used for laser processing, a larger electric current flows through a semiconductor laser element mounted on the device in order to obtain a high-power laser beam, and the amount of heat generated from the semiconductor laser element is increased accordingly. When reaching a high temperature, semiconductor laser elements suffer performance degradation, such as a decrease in laser output. To stabilize the performance of semiconductor laser elements and prevent the overheating thereof, semiconductor laser devices are configured to have a cooling function of releasing heat from both sides of the semiconductor laser elements.

With reference to FIG. 18, conventional semiconductor laser device 900 in Patent Literature 1 will be described. FIG. 18 is a perspective view and a side view of conventional semiconductor laser device 900.

As illustrated in FIG. 18, conventional semiconductor laser device 900 is provided with submount 902 and LD (Laser Diode) bar 903 on an end portion of heat sink 901. Insulating layer 904 is provided in a region which is on heat sink 901 and in which submount 902 is not provided. Bumps 905 are formed on LD bar 903, and lead-out electrode 906 is provided on insulating layer 904 and bumps 905. Furthermore, filler 907 is filled in a space between LD bar 903 and lead-out electrode 906 in which no bump 905 is present.

CITATION LIST

Patent Literature

PTL 1: Unexamined Japanese Patent Publication No. 2003-86883

SUMMARY

Conventional semiconductor laser device 900 is configured such that filler 907 made of an Ag paste or a solder material is filled between LD bar 903 and lead-out electrode 906 to improve the thermal conductivity. However, when an Ag paste or a solder material is filled between LD bar 903 and lead-out electrode 906, the difference in the coefficient of thermal expansion between LD bar 903 and lead-out electrode 906 may cause a crack at the interface between lead-out electrode 906 and filler 907 or inside filler 907. The development of such crack causes a decrease in thermal conductivity and a decrease in electrical connection (in other words, an increase in electrical resistance) between LD bar 903 and lead-out electrode 906, thereby causing performance degradation or breakdown of the semiconductor laser device.

To solve the above-mentioned problems, a semiconductor device according to the present disclosure includes a first electrode block, a submount, an insulating layer, a semiconductor element, a bump, and a second electrode block. The first electrode block is electrically conductive. The submount is electrically conductive, provided in a first region of the upper surface of the first electrode block, and electrically connected to the first electrode block. The insulating layer is provided in a second region of the upper surface of the first electrode block other than the first region. The semiconductor element is provided on the submount and has a first electrode electrically connected to the submount. The bump is electrically conductive; provided on the upper surface of a second electrode, opposite the first electrode, of the semiconductor element; and electrically connected to the second electrode. The second electrode block is provided on the bump and the insulating layer, and electrically conductive. A third region of the lower surface of the second electrode block is electrically connected to the bump via an electrically conductive metal layer in a third region. Furthermore, a fourth region of the lower surface of the second electrode block is mounted on the insulating layer. An electrically conductive metal sheet is provided between the metal layer and the bump.

As described above, according to the present disclosure, the provision of the metal layer and the metal sheet between the bump and the second electrode block allows a stress caused by the difference in the coefficient of thermal expansion between the semiconductor element and the second electrode block to be relaxed, and allows an electrical connection between the semiconductor element and the second electrode block to be stably ensured.

DESCRIPTION OF EMBODIMENTS

First Exemplary Embodiment

Hereinafter, a first exemplary embodiment of the present disclosure will be described with reference to FIG. 1 to FIG. 7.

Figure 1:
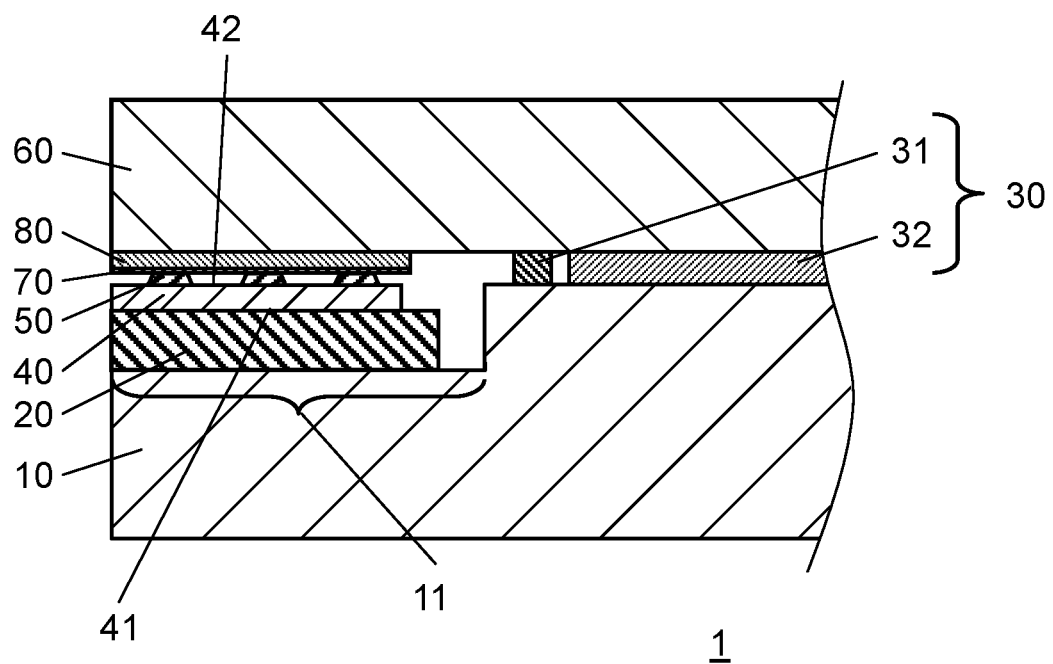
FIG. 1 is a cross-sectional view illustrating a schematic configuration of semiconductor laser device 1 according to a first exemplary embodiment.

FIG. 1 is a cross-sectional view illustrating a schematic configuration of semiconductor laser device 1 according to the present embodiment. FIG. 2 to FIG. 7 are perspective views illustrating a method for manufacturing semiconductor laser device 1 according to the present embodiment.

As illustrated in FIG. 1, semiconductor laser device 1 (semiconductor device) includes electrode block 10 (first electrode block), submount 20, insulating layer 30, semiconductor laser element 40 (semiconductor element), bump 50, and electrode block 60 (second electrode block). Furthermore, metal sheet 70 and metal layer 80 are provided in this order from bump 50 side between bump 50 and electrode block 60.

Electrode block 10 is electrically conductive, contains copper (Cu) as a main material, and is formed by plating a copper block with nickel (Ni) and gold (Au) in this order. As illustrated in FIG. 1, recess 11 is provided in an end portion of the upper surface of electrode block 10, submount 20 is provided in a region (first region) in recess 11, and insulating layer 30 is provided in a region (second region) of the upper surface of electrode block 10 other than recess 11. In other words, recess 11 is surrounded in the form of a letter U by insulating layer 30 (refer to FIGS. 2 to 5). The upper surface in recess 11 is located lower than the upper surface in a region other than recess 11.

Submount 20 is electrically conductive, and the main material thereof is a copper-tungsten alloy (CuW). As illustrated in FIG. 1, submount 20 is disposed in the region in recess 11 so that a side surface of submount 20 is aligned with a side surface of electrode block 10. Submount 20 is electrically connected to electrode block 10, and bonded to electrode block 10 by a solder material (not illustrated) containing tin (Sn) and silver (Ag) in the proportion of 96.5% to 3.5%, respectively. It should be noted that the main material of submount 20 may be a copper-molybdenum alloy (CuMo).

Insulating layer 30 has insulating properties, and the main material thereof is, for example, polyimide or ceramic. As illustrated in FIG. 1, insulating layer 30 is provided in the region of the upper surface of electrode block 10 other than recess 11. It should be noted that, in the present embodiment, insulating layer 30 is provided so as to be divided into two parts, that is, insulating layer 31 and insulating layer 32, but may be provided as a single unit. The main material of insulating layer 31 is polyimide, and the main material of insulating layer 32 is aluminum nitride (AlN).

The lower surface of semiconductor laser element 40 serves as positive electrode 41 (first electrode), and the upper surface of semiconductor laser element 40 serves as negative electrode 42 (second electrode). When an electric current flows from positive electrode 41 toward negative electrode 42, a laser beam is emitted from a light emitting surface (on the left-hand side of FIG. 1) of semiconductor laser element 40. As illustrated in FIG. 1, semiconductor laser element 40 is disposed on submount 20 so that the light emitting surface of semiconductor laser element 40 is aligned with a side surface of submount 20. Positive electrode 41 of semiconductor laser element 40 is electrically connected to submount 20, and bonded to submount 20 by a solder material (not illustrated) containing gold and tin in the proportion of 80% to 20%, respectively.

Bump 50 is electrically conductive, and the main material thereof is gold. As illustrated in FIG. 1, a plurality of bumps 50 are provided on negative electrode 42 of semiconductor laser element 40, and electrically connected to negative electrode 42 of semiconductor laser element 40. The height of bump 50 is approximately 80 μm to approximately 120 μm.

Metal sheet 70 is electrically conductive, and the main material thereof is gold. Metal sheet 70 is formed by laminating three or four sheets of metal foil each having a thickness of approximately 8 μm to approximately 12 μm, and thus has a total thickness of approximately 24 μm to approximately 48 μm. It should be noted that the number of the metal foil sheets constituting metal sheet 70 and the total thickness of metal sheet 70 are not limited to the above. Metal sheet 70 is provided on bumps 50 so that the upper tips of bumps 50 bite thereinto, and is electrically connected to bumps 50. The tips of bumps 50 thus provided to bite into metal sheet 70 are preferably in physical contact with metal sheet 70 without being chemically bonded (joined) to metal sheet 70. This allows bumps 50 to horizontally move to push metal sheet 70 when there is a difference in the coefficient of thermal expansion between semiconductor laser element 40 and electrode block 60, so that a stress can be relaxed.

Metal layer 80 is electrically conductive, and the main material thereof is gold. The thickness of metal layer 80 is approximately 50 μm to approximately 100 μm. Metal layer 80 is provided on metal sheet 70, and electrically connected to metal sheet 70. Furthermore, metal layer 80 and metal sheet 70 are preferably in physical contact with each other through their surfaces without being chemically bonded (joined) to each other. This allows metal sheet 70 to horizontally move to slide along metal layer 80 when there is a difference in the coefficient of thermal expansion between semiconductor laser element 40 and electrode block 60, so that a stress can be relaxed.

Electrode block 60 is electrically conductive, contains copper (Cu) as a main material, and is formed by plating a copper block with nickel (Ni) and gold (Au) in this order. As illustrated in FIG. 1, electrode block 60 is provided on metal layer 80 and insulating layer 30, and electrically connected to metal layer 80. Metal layer 80 is provided in a region (third region) of the lower surface of electrode block 60, which region faces semiconductor laser element 40. Metal layer 80 is provided by pressure-bonding a thin metal plate having a thickness of approximately 50 μm to 100 μm to electrode block 60. The way of provision is not limited to this, and metal layer 80 may be provided by metal plating growth to a thickness of approximately 50 μm to approximately 100 μm in a region of the lower surface of electrode block 60, which region faces semiconductor laser element 40. Furthermore, electrode block 60 is bonded to insulating layer 30 in a region (fourth region) of the lower surface of electrode block 60 other than the region facing semiconductor laser element 40.

It should be noted that the depth (height) of recess 11 is determined in consideration of the thicknesses of submount 20, semiconductor laser element 40, bump 50, metal sheet 70, metal layer 80, and insulating layer 30. In particular, in consideration that bumps 50 bite into metal sheet 70, the depth (height) of recess 11 is determined, for example, by subtracting the thickness of insulating layer 30 from the sum of the thicknesses of submount 20, semiconductor laser element 40, bump 50, and metal layer 80.

Next, with reference to FIG. 2 to FIG. 7, a method for manufacturing semiconductor laser device 1 according to the present embodiment will be described. FIG. 2 to FIG. 7 are perspective views illustrating the method for manufacturing semiconductor laser device 1 according to the present embodiment.

Figure 2:
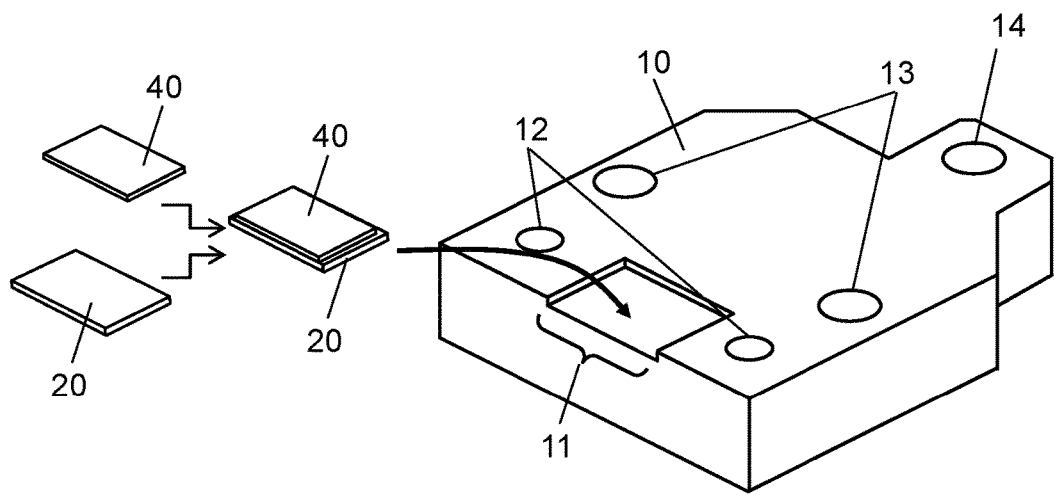
FIG. 2 is a perspective view illustrating a method for manufacturing semiconductor laser device 1 according to the first exemplary embodiment.

First, as illustrated in FIG. 2, submount 20 mounted with semiconductor laser element 40 is mounted on recess 11 of electrode block 10. Semiconductor laser element 40 is bonded to submount 20 by a solder material containing gold and tin so that positive electrode 41 is connected to submount 20. Submount 20 used here is slightly larger than semiconductor laser element 40. Semiconductor laser element 40 is disposed so that the light emitting surface of semiconductor laser element 40 is aligned with a side surface of submount 20, and other side surfaces of semiconductor laser element 40 are disposed inside corresponding side surfaces of submount 20. Submount 20 is bonded to recess 11 of electrode block 10 by a solder material containing tin and silver. Recess 11 is formed larger than submount 20. Submount 20 is disposed so that the light emitting surface of semiconductor laser element 40 is aligned with a side surface of electrode block 10, and the side surfaces of submount 20 other than the side surface aligned with the light emitting surface are disposed inside corresponding side surfaces of recess 11. It should be noted that, in electrode block 10, connection holes 12 are provided on both sides of recess 11 in which semiconductor laser element 40 is disposed, and connection holes 13 are provided on the opposite side to the outgoing direction of a laser beam with respect to connection holes 12. In an end portion of electrode block 10 on the opposite side to recess 11, terminal hole 14 for connecting the wiring connected to a power supply is provided. A screw thread is formed in the inner side surface of each of connection holes 12, connection holes 13, and terminal hole 14 for the purpose of fastening with a screw.

Figure 3:
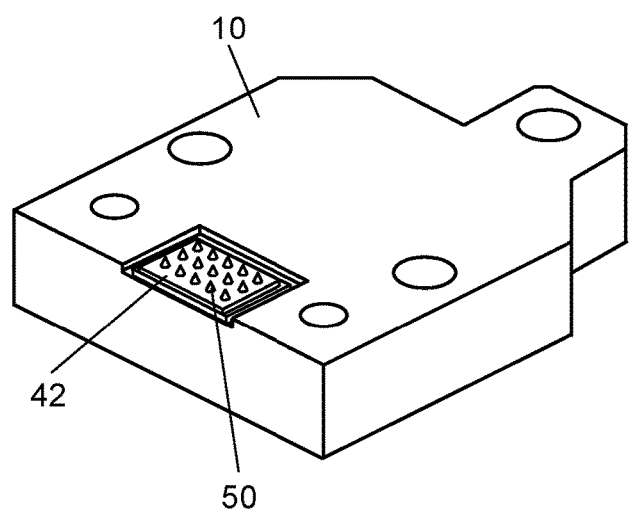
FIG. 3 is a perspective view illustrating the method for manufacturing semiconductor laser device 1 according to the first exemplary embodiment.

Next, as illustrated in FIG. 3, a plurality of bumps 50 are formed on negative electrode 42 of semiconductor laser element 40. Bump 50 is formed in such a manner that a gold wire having a tip made spherical by melting is brought into contact with negative electrode 42 and joined to negative electrode 42 with ultrasonic waves. Then, the gold wire is pulled while given ultrasonic waves, so that bump 50 having a sharp-pointed upper tip is formed.

Figure 4:
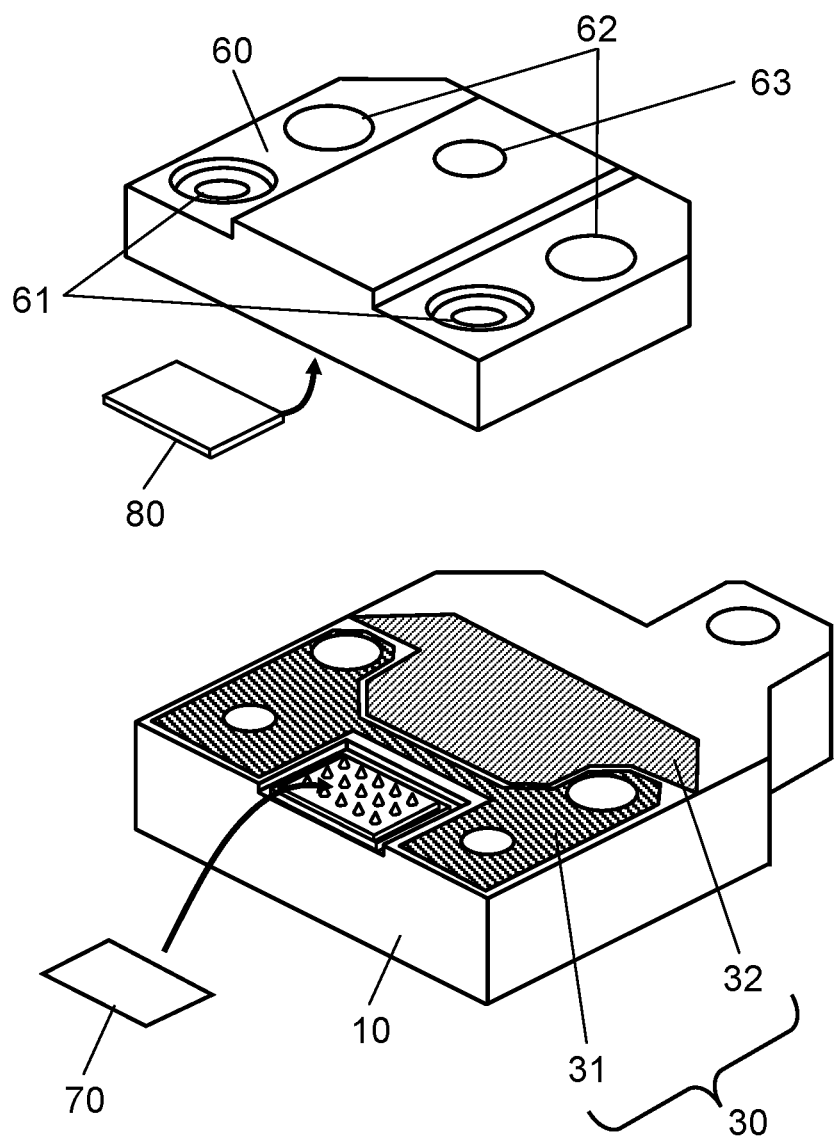
FIG. 4 is a perspective view illustrating the method for manufacturing semiconductor laser device 1 according to the first exemplary embodiment.

Next, as illustrated in FIG. 4, insulating layer 31 and insulating layer 32 (collectively referred to as insulating layer 30) are formed in a region of the upper surface of electrode block 10 other than recess 11. For insulating layer 31, for example, an insulating material made of mainly polyimide and becoming less deformed (being hard) is preferably used. This allows electrode block 60 to be stabilized above semiconductor laser element 40. For insulating layer 32, for example, an insulating material made of mainly aluminum nitride, having high thermal conductivity, and being soft is preferably used. This allows the adhesion between electrode block 60 and insulating layer 32 to be increased, whereby heat is more easily conducted to electrode block 10. In other words, insulating layer 31 is made of a material harder than that of insulating layer 32, and insulating layer 32 is made of a material having higher thermal conductivity than that of insulating layer 31. Furthermore, metal layer 80 is formed in a region of the lower surface of electrode block 60, which region faces semiconductor laser element 40. In the present embodiment, metal layer 80 is formed by pressure-bonding a metal plate to electrode block 60, but may be formed by metal plating growth. Metal sheet 70 is placed on bumps 50. It should be noted that, in electrode block 60, connection holes 61 are provided at positions each corresponding to connection holes 12 of electrode block 10, and connection holes 62 are provided at positions each corresponding to connection holes 13 of electrode block 10. Furthermore, terminal hole 63 for connecting the wiring connected to a power supply is provided in the central portion of electrode block 60. A screw thread is formed in the inner side surface of each of connection holes 61, connection holes 62, and terminal hole 63 for the purpose of fastening with a screw.

Figure 5:
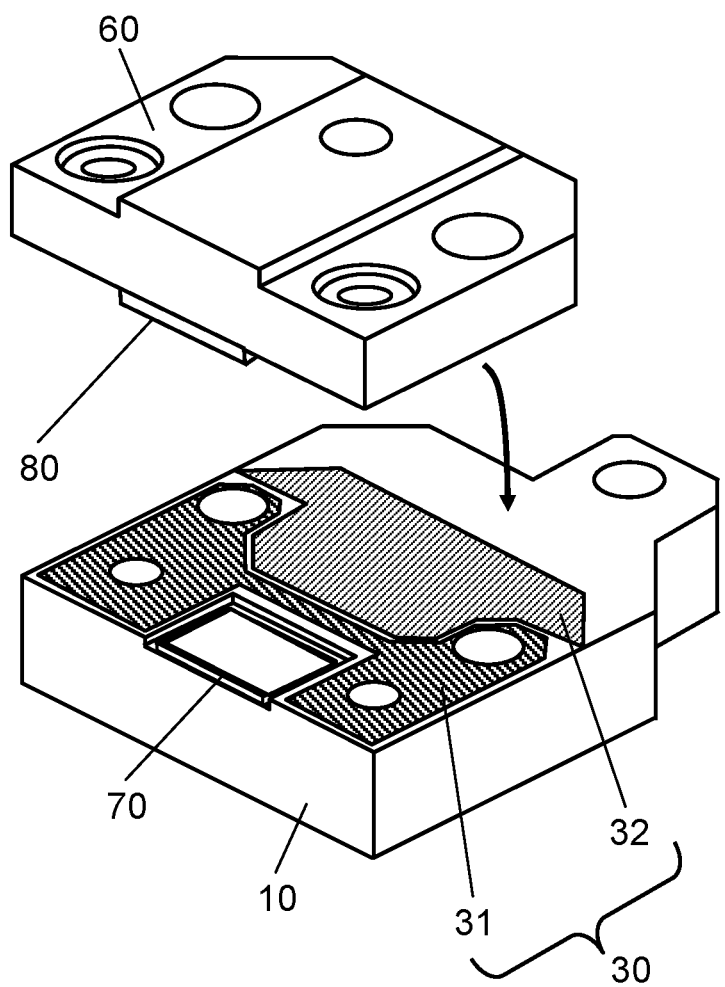
FIG. 5 is a perspective view illustrating the method for manufacturing semiconductor laser device 1 according to the first exemplary embodiment.

Next, as illustrated in FIG. 5, electrode block 60 provided with metal layer 80 is mounted on electrode block 10 provided with submount 20, insulating layer 30, semiconductor laser element 40, and bumps 50. At this point, metal sheet 70 placed on bumps 50 is sandwiched between bumps 50 and metal layer 80.

Figure 6:
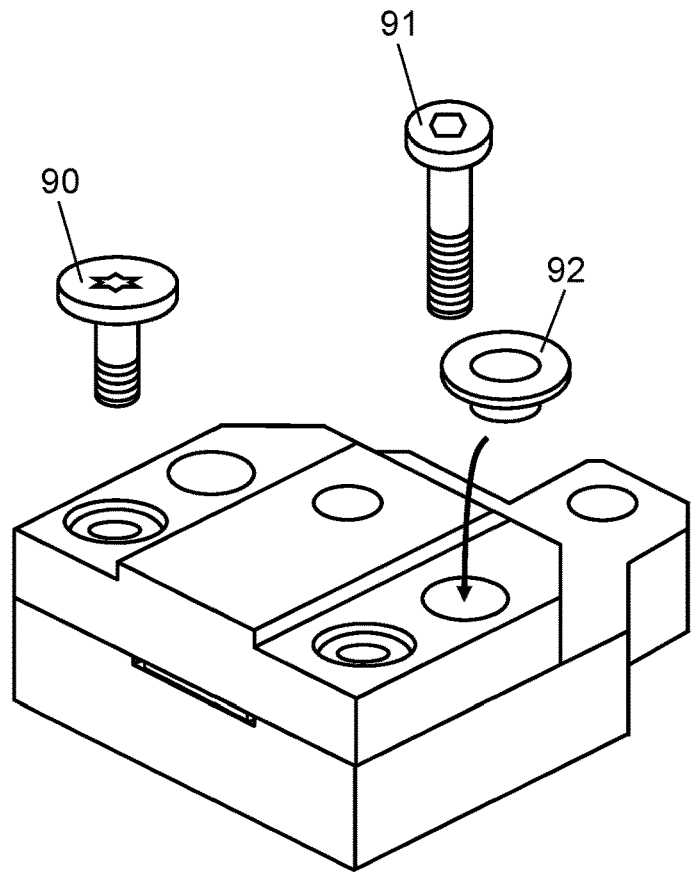
FIG. 6 is a perspective view illustrating the method for manufacturing semiconductor laser device 1 according to the first exemplary embodiment.

Next, as illustrated in FIG. 6, electrode block 10 and electrode block 60 are united by joining members. Specifically, connection hole 12 of electrode block 10 is connected to connection hole 61 of electrode block 60 with insulating screw 90. Furthermore, connection hole 13 of electrode block 10 is connected to connection hole 62 of electrode block 60 with electrically conductive screw 91. Insulating member 92 is provided between electrically conductive screw 91 and electrode block 60. In other words, insulating screw 90 and insulating member 92 prevents electrode block 10 and electrode block 60 from being electrically connected to each other. In place of insulating screw 90, electrically conductive screw 91 and insulating member 92 may be used. In place of electrically conductive screw 91 and insulating member 92, insulating screw 90 may be used. Insulating screw 90 and insulating member 92 are made of an insulating material mainly containing ceramic or resin.

Figure 7:
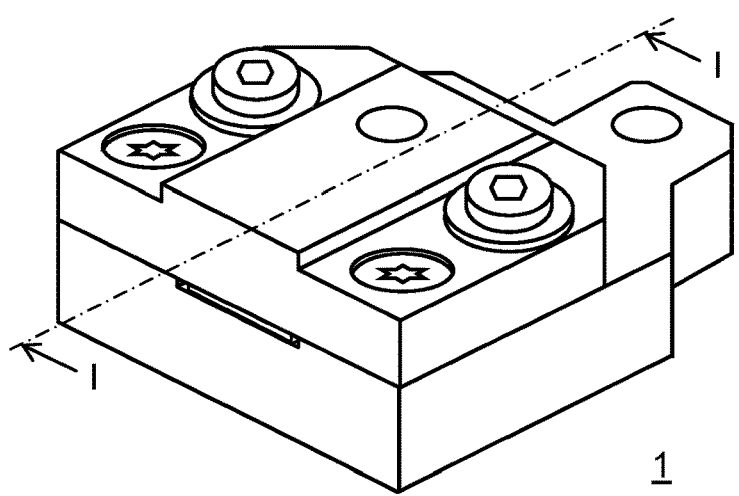
FIG. 7 is a perspective view illustrating the method for manufacturing semiconductor laser device 1 according to the first exemplary embodiment.

As describe above, semiconductor laser device 1 as illustrated in FIG. 7 is completed. It should be noted that a cross-section taken along line I-I in FIG. 7 corresponds to the cross-sectional view of FIG. 1.

Second Exemplary Embodiment

Next, a second exemplary embodiment of the present disclosure will be described with reference to FIG. 8 to FIG.

14. It should be noted that the same constituents as those of the first exemplary embodiment are given the same reference numerals, and the description of those constituents will be omitted. FIG. 8 is a cross-sectional view illustrating a schematic configuration of power semiconductor device 2 according to the present embodiment. FIG. 9 to FIG. 14 are perspective views illustrating a method for manufacturing power semiconductor device 2 according to the present embodiment.

In the first exemplary embodiment, semiconductor laser element 40 that outputs a laser beam is used as a semiconductor element, and semiconductor laser element 40 and submount 20 are mounted on an end portion of the upper surface of electrode block 10. By contrast, in the present embodiment, power semiconductor element 140 is used as a semiconductor element, and power semiconductor element 140 and submount 20 are mounted in the central portion of the upper surface of electrode block 110.

Figure 8:
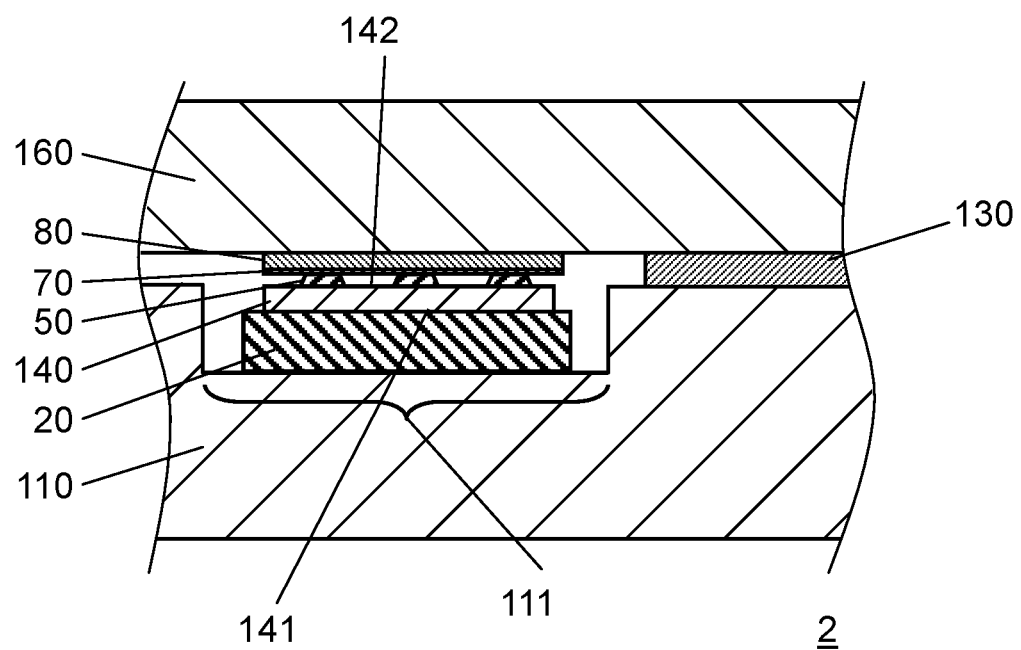
FIG. 8 is a cross-sectional view illustrating a schematic configuration of power semiconductor device 2 according to a second exemplary embodiment.

As illustrated in FIG. 8, power semiconductor device 2 (semiconductor device) includes electrode block 110 (first electrode block), submount 20, insulating layer 130, power semiconductor element 140 (semiconductor element), bump 50, and electrode block 160 (second electrode block). Furthermore, metal sheet 70 and metal layer 80 are provided in this order from bump 50 side between bump 50 and electrode block 160. It should be noted that submount 20, bump 50, metal sheet 70, and metal layer 80 are the same as those of the first exemplary embodiment, and therefore the description of these constituents will be omitted.

Electrode block 110 is electrically conductive, and the material thereof is the same as that of the first exemplary embodiment. As illustrated in FIG. 8, recess 111 is provided in the central portion of the upper surface of electrode block 110, submount 20 is provided in a region (first region) in recess 111, and insulating layer 130 is provided in a region (second region) of the upper surface of the electrode block 110 other than recess 111. In other words, insulating layer 130 surrounds the entire perimeter of recess 111 (refer to FIGS. 9 to 12). The upper surface in recess 111 is located lower than the upper surface in a region other than recess 111.

Insulating layer 130 has insulating properties, and the main material thereof is polyimide. As illustrated in FIG. 8, insulating layer 130 is provided in a region of the upper surface of electrode block 110 other than recess 111.

Power semiconductor element 140 is a power diode into which a high voltage of not less than 60 V is inputted, whose lower surface serves as positive electrode 141 (first electrode), and whose upper surface serves as negative electrode 142 (second electrode). Power semiconductor element 140 is configured such that an electric current flows from positive electrode 141 toward negative electrode 142, whereas no electric current flows from negative electrode 142 toward positive electrode 141. As illustrated in FIG. 8, power semiconductor element 140 is disposed at the center of submount 20 so that side surfaces of power semiconductor element 140 are each located inside corresponding side surfaces of submount 20. Positive electrode 141 of power semiconductor element 140 is electrically connected to submount 20, and bonded to submount 20 by a solder material (not illustrated) containing gold and tin in the proportion of 80% to 20%, respectively.

Electrode block 160 is electrically conductive, and the material thereof is the same as that of the first exemplary embodiment. As illustrated in FIG. 8, electrode block 160 is provided on metal layer 80 and insulating layer 130, and electrically connected to metal layer 80. Metal layer 80 is provided in a region (third region) of the lower surface of electrode block 160, which region faces power semiconductor element 140. Metal layer 80 is provided by pressure-bonding a thin metal plate having a thickness of approximately 50 μm to 100 μm to electrode block 160. The way of provision is not limited to the above, and metal layer 80 may be provided by metal plating growth to a thickness of approximately 50 μm to approximately 100 μm in the region of the lower surface of electrode block 160, which region faces power semiconductor element 140. Furthermore, electrode block 160 is bonded to insulating layer 130 in a region (fourth region) of the lower surface of electrode block 160 other than the region facing power semiconductor element 140.

The depth (height) of recess 111 may be determined in the same manner as that in the first exemplary embodiment, with semiconductor laser element 40 taken as power semiconductor element 140 and insulating layer 30 taken as insulating layer 130.

Next, with reference to FIG. 9 to FIG. 14, a method for manufacturing power semiconductor device 2 according to the present embodiment will be described. FIG. 9 to FIG. 14 are perspective views illustrating the method for manufacturing power semiconductor device 2 according to the present embodiment.

Figure 9:
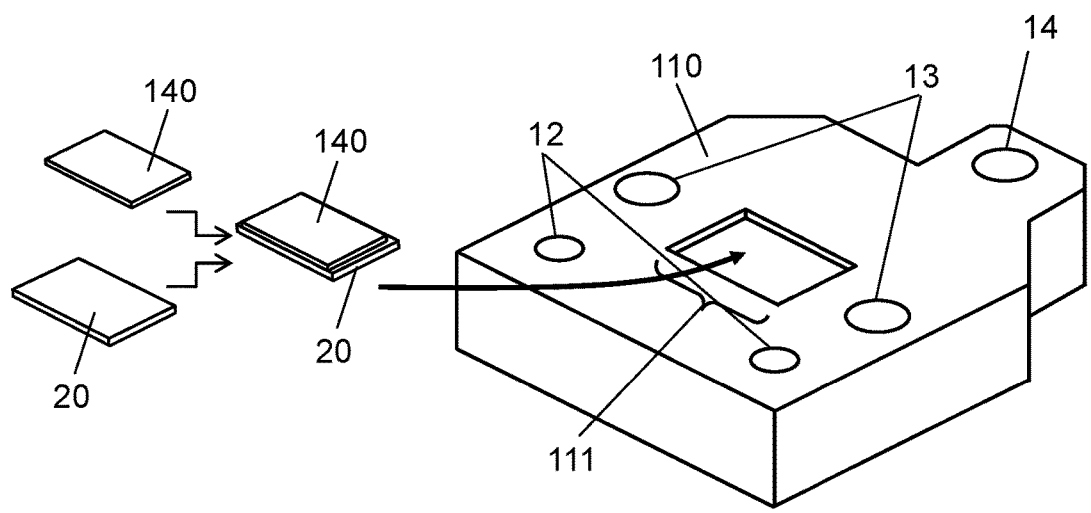
FIG. 9 is a perspective view illustrating a method for manufacturing power semiconductor device 2 according to the second exemplary embodiment.

First, as illustrated in FIG. 9, submount 20 mounted with power semiconductor element 140 is mounted on recess 111 of electrode block 110. The present embodiment differs from the first exemplary embodiment in FIG. 2 in that power semiconductor element 140 is used in the present embodiment in place of semiconductor laser element 40 in the first exemplary embodiment. Furthermore, in the first exemplary embodiment, recess 11 is formed in the end portion of electrode block 10, whereas, in the present embodiment, recess 111 is formed in the central portion of electrode block 110. Other aspects are the same as those of the first exemplary embodiment.

Figure 10:
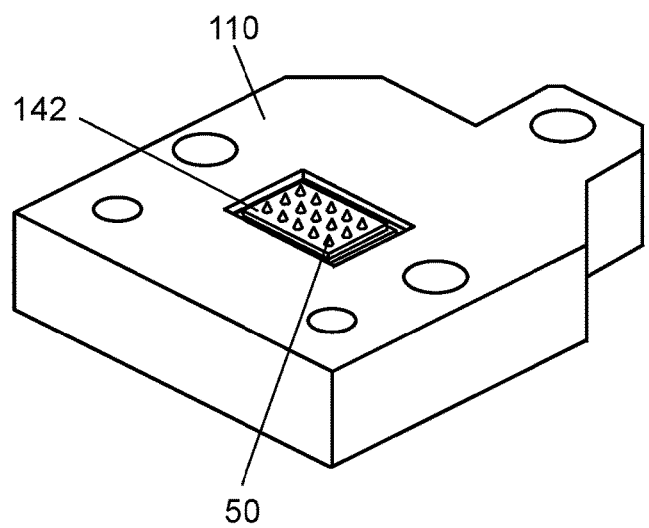
FIG. 10 is a perspective view illustrating the method for manufacturing power semiconductor device 2 according to the second exemplary embodiment.

Next, as illustrated in FIG. 10, a plurality of bumps 50 are formed on negative electrode 142 of power semiconductor element 140. The bumps are formed in the same manner as in the first exemplary embodiment.

Figure 11:
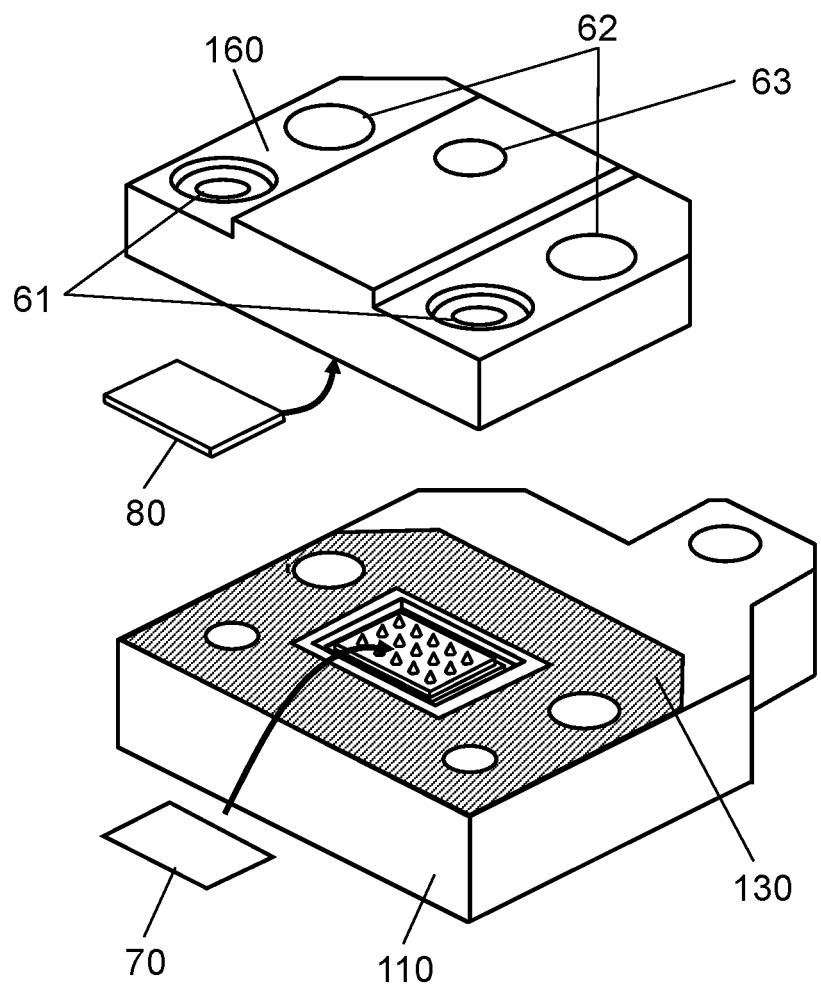
FIG. 11 is a perspective view illustrating the method for manufacturing power semiconductor device 2 according to the second exemplary embodiment.

Next, as illustrated in FIG. 11, insulating layer 130 is formed in a region of the upper surface of electrode block 110 other than recess 111. Furthermore, metal layer 80 is formed in a region of the lower surface of electrode block 160, which region faces power semiconductor element 140. In the present embodiment, metal layer 80 is formed by pressure-bonding a metal plate to electrode block 160, but may be formed by metal plating growth. Furthermore, metal sheet 70 is placed on bumps 50. Other aspects are the same as those of the first exemplary embodiment.

Figure 12:
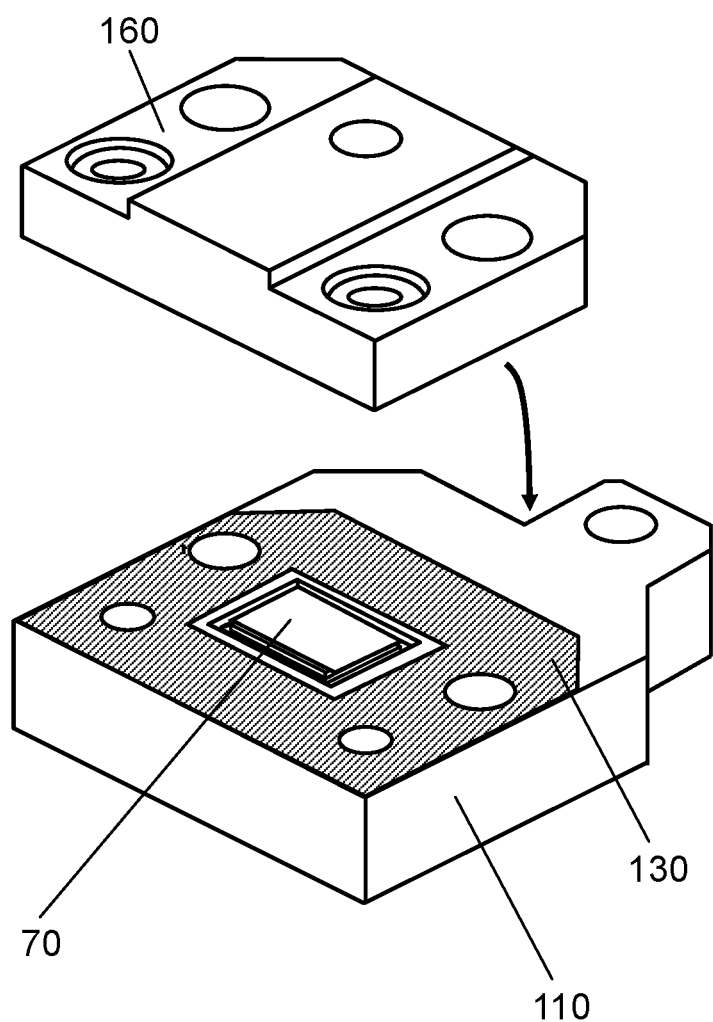
FIG. 12 is a perspective view illustrating the method for manufacturing power semiconductor device 2 according to the second exemplary embodiment.

Next, as illustrated in FIG. 12, electrode block 160 provided with metal layer 80 (not visible, and thus not illustrated) is mounted on electrode block 110 provided with submount 20, insulating layer 130, power semiconductor element 140, and bumps 50. At this point, metal sheet 70 placed on bumps 50 is sandwiched between bumps 50 and metal layer 80.

Figure 13:
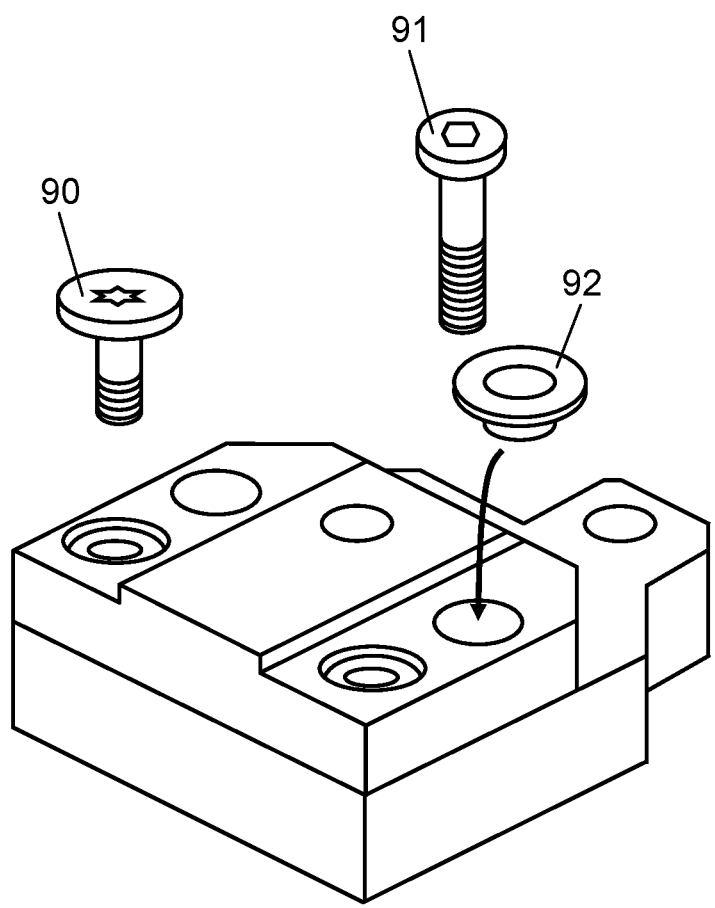
FIG. 13 is a perspective view illustrating the method for manufacturing power semiconductor device 2 according to the second exemplary embodiment.

Next, as illustrated in FIG. 13, electrode block 110 and electrode block 160 are united by joining members. This aspect is the same as that of the first exemplary embodiment.

Figure 14:
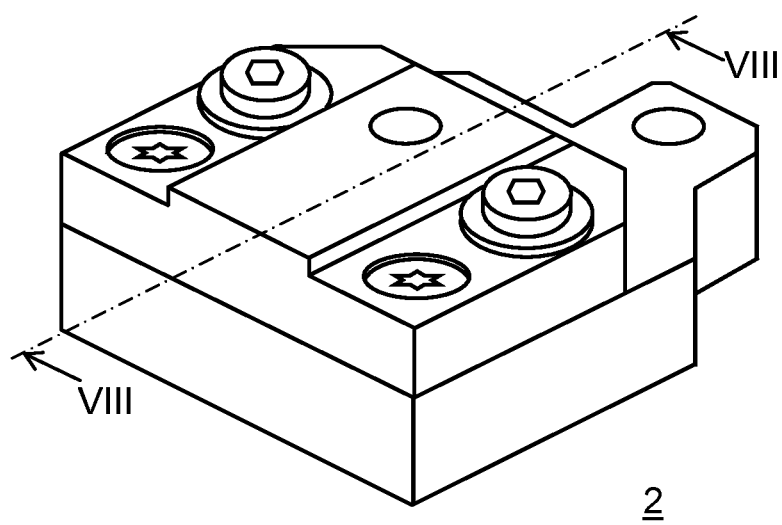
FIG. 14 is a perspective view illustrating the method for manufacturing power semiconductor device 2 according to the second exemplary embodiment.

As described above, power semiconductor device 2 is completed as illustrated in FIG. 14. It should be noted that a cross-section taken along line VIII-VIII in FIG. 14 corresponds to the cross-sectional view of FIG. 8.

Third Exemplary Embodiment

Next, a third exemplary embodiment of the present disclosure will be described with reference to FIG. 15 and FIG.

16. It should be noted that the same constituents as those of the first exemplary embodiment are given the same reference numerals, and the description of those constituents will be omitted. FIG. 15 is a cross-sectional view illustrating a schematic configuration of semiconductor laser device 3 according to the present embodiment. FIG. 16 is a perspective view illustrating the schematic configuration of semiconductor laser device 3 according to the present embodiment.

In the first exemplary embodiment, recess 11 is provided in the upper surface of electrode block 10 on which submount 20 is mounted, and the lower surface of electrode block 60 facing the upper surface of electrode block 10 is flat. By contrast, in the present embodiment, the upper surface of electrode block 210 on which submount 20 is mounted is flat, and recess 261 is provided in the lower surface of electrode block 260 facing the upper surface of electrode block 210.

Figure 15:
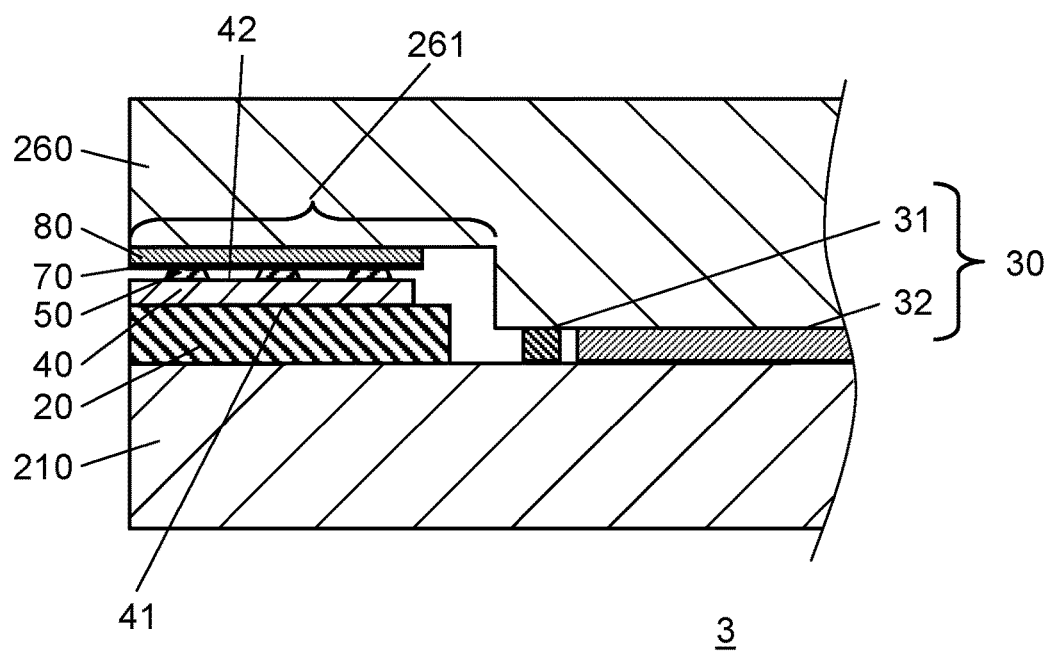
FIG. 15 is a cross-sectional view illustrating a schematic configuration of semiconductor laser device 3 according to a third exemplary embodiment.
Figure 16:
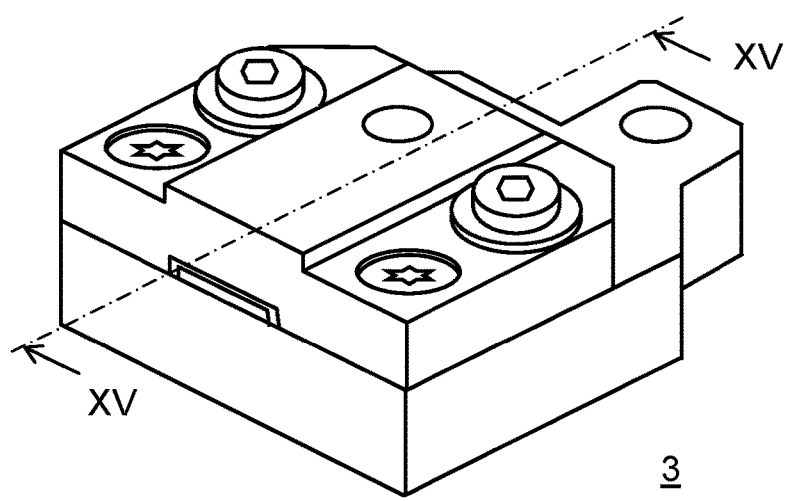
FIG. 16 is a perspective view illustrating the schematic configuration of semiconductor laser device 3 according to the third exemplary embodiment.

As illustrated in FIG. 15, semiconductor laser device 3 (semiconductor device) includes electrode block 210 (first electrode block), submount 20, insulating layer 30, semiconductor laser element 40 (semiconductor element), bump 50, and electrode block 260 (second electrode block). Furthermore, metal sheet 70 and metal layer 80 are provided in this order from bump 50 side between bump 50 and electrode block 260. It should be noted that submount 20, insulating layer 30, semiconductor laser element 40, bump 50, metal sheet 70, and metal layer 80 are the same as those of the first exemplary embodiment, and therefore, the description of these constituents will be omitted.

Electrode block 210 is electrically conductive, and the material thereof is the same as that of the first exemplary embodiment. As illustrated in FIG. 15, the upper surface of electrode block 210 is flat, and an end region (first region) thereof is provided with submount 20, and a region (second region) of the upper surface of electrode block 210 other than the end region is provided with insulating layer 30. As is the case with the first exemplary embodiment, insulating layer 30 may be divided into insulating layer 31 and insulating layer 32, and the materials of insulating layers 30 to 32 are the same as those of the first exemplary embodiment.

Electrode block 260 is electrically conductive, and the material thereof is the same as that of the first exemplary embodiment. As illustrated in FIG. 15, electrode block 260 is provided on metal layer 80 and insulating layer 30, and electrically connected to metal layer 80. Furthermore, recess 261 is provided in an end portion of the lower surface of electrode block 260, and metal layer 80 is provided in a region (third region) in recess 261, which region faces semiconductor laser element 40. A region (fourth region) of the lower surface of electrode block 260 other than recess 261 is bonded to insulating layer 30. In other words, the lower surface in recess 261 is located higher than the lower surface in the region other than recess 261. Metal layer 80 is provided by pressure-bonding a thin metal plate having a thickness of approximately 50 μm to 100 μm to electrode block 260. The way of provision is not limited to the above, and metal layer 80 may be provided by metal plating growth to a thickness of approximately 50 μm to approximately 100 μm in a region in recess 261 of the lower surface of electrode block 260, which region faces semiconductor laser element 40.

The depth (height) of recess 261 may be determined in the same manner as that in the first exemplary embodiment.

It should be noted that a cross-section taken along line XV-XV in FIG. 16 corresponds to the cross-sectional view of FIG. 15.

Fourth Exemplary Embodiment

Figure 17:
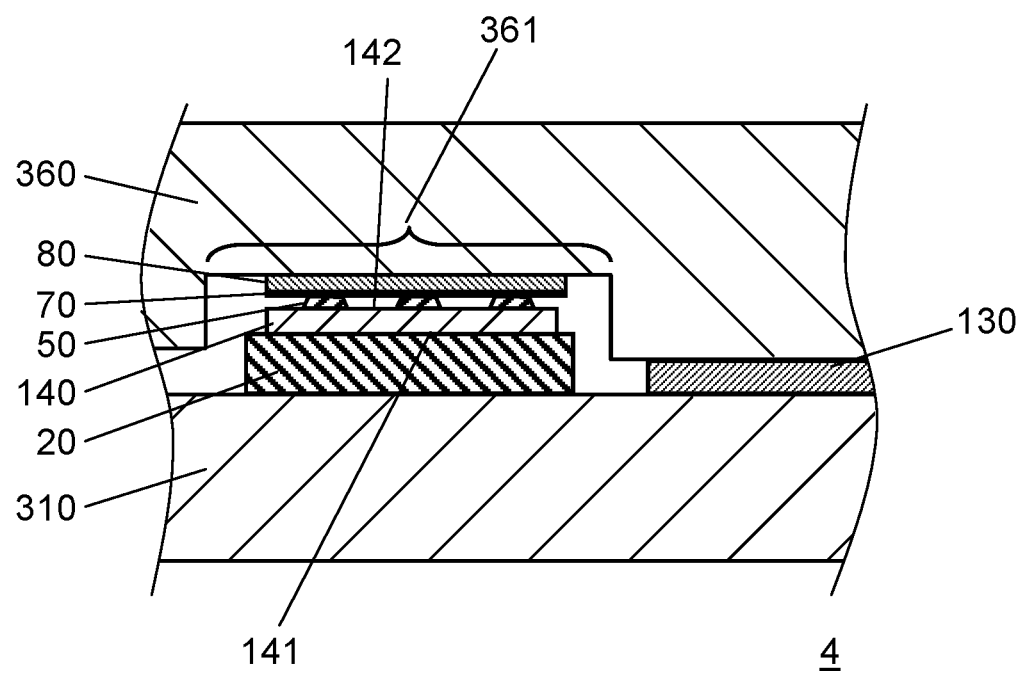
FIG. 17 is a cross-sectional view illustrating a schematic configuration of power semiconductor device 4 according to a fourth exemplary embodiment.
Figure 18:
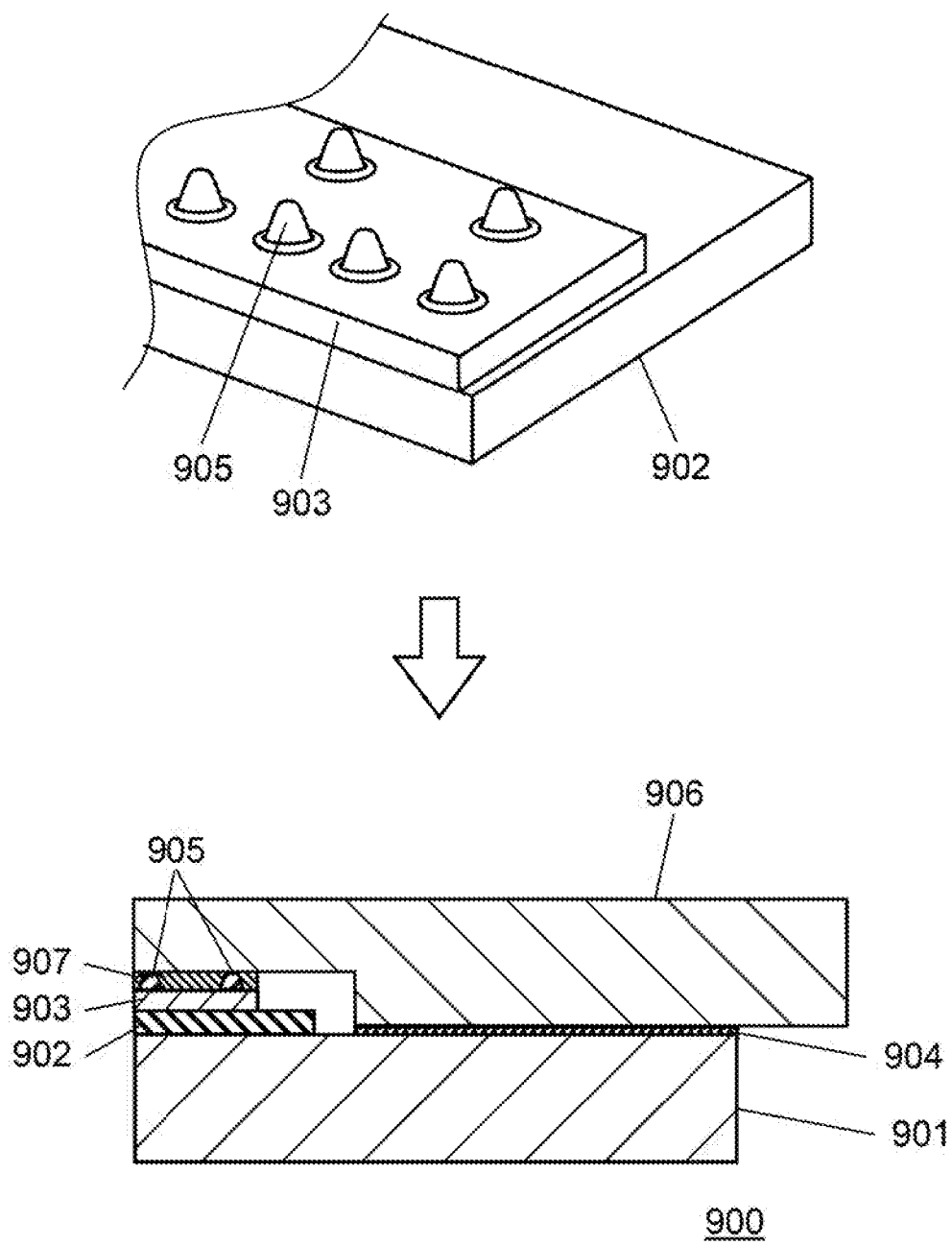
FIG. 18 is a view (a perspective view and a side view) illustrating a schematic configuration of conventional semiconductor laser device 900.

Next, a fourth exemplary embodiment of the present disclosure will be described with reference to FIG. 14 and FIG. 17. It should be noted that the same constituents as those of the second exemplary embodiment are given the same reference numerals, and the description of those constituents will be omitted. FIG. 17 is a cross-sectional view illustrating a schematic configuration of power semiconductor device 4 according to the present embodiment.

In the second exemplary embodiment, recess 111 is provided in the upper surface of electrode block 110 on which submount 20 is mounted, and the lower surface of electrode block 160 facing the upper surface of electrode block 110 is flat. By contrast, in the present embodiment, the upper surface of electrode block 310 on which submount 20 is mounted is flat, and recess 361 is provided in the lower surface of electrode block 360 facing the upper surface of electrode block 310.

As illustrated in FIG. 17, power semiconductor device 4 (semiconductor device) includes electrode block 310 (first electrode block), submount 20, insulating layer 130, power semiconductor element 140 (semiconductor element), bump 50, and electrode block 360 (second electrode block). Furthermore, metal sheet 70 and metal layer 80 are provided in this order from bump 50 side between bump 50 and electrode block 360. It should be noted that submount 20, insulating layer 130, power semiconductor element 140, bump 50, metal sheet 70, and metal layer 80 are the same as those of the second exemplary embodiment, and therefore the description of these constituents will be omitted.

Electrode block 310 is electrically conductive, and the material thereof is the same as that of the second exemplary embodiment. As illustrated in FIG. 17, the upper surface of electrode block 310 is flat and a central region (first region) thereof is provided with submount 20, and a region (second region) of the upper surface of electrode block 310 other than the central region is provided with insulating layer 130. Insulating layer 130 is also the same as that of the second exemplary embodiment.

Electrode block 360 is electrically conductive, and the material thereof is the same as that of the second exemplary embodiment. As illustrated in FIG. 17, electrode block 360 is provided on metal layer 80 and insulating layer 130, and electrically connected to metal layer 80. Furthermore, recess 361 is provided in the central portion of the lower surface of electrode block 360, and metal layer 80 is provided in a region (third region) in recess 361, which region faces power semiconductor element 140. A region (fourth region) of the lower surface of electrode block 360 other than recess 361 is bonded to insulating layer 130. In other words, the lower surface in recess 361 is located higher than the lower surface in a region other than recess 361. Metal layer 80 is provided by pressure-bonding a thin metal plate having a thickness of approximately 50 μm to 100 μm to electrode block 360. The way of provision is not limited to the above, and metal layer 80 may be provided by metal plating growth to a thickness of approximately 50 μm to approximately 100 μm in a region in recess 361 of the lower surface of electrode block 360, which region faces power semiconductor element 140.

The depth (height) of recess 361 may be determined in the same manner as that in the second exemplary embodiment.

It should be noted that a cross-section taken along line VIII-VIII in FIG. 14 corresponds to the cross-sectional view of FIG. 17.

Modification of First and Third Exemplary Embodiments

Next, modifications of the first and third exemplary embodiments will be described. In the first and third exemplary embodiments, an insulating material that is comparatively less prone to pressure deformation, such as polyimide or ceramic, is used as a material for insulating layer 31, whereas a comparatively soft insulating material such as aluminum nitride is used as a material for insulating layer 32. There is a risk that the difference in hardness between these insulating materials may cause electrode block 60 (260) to be inclined. In other words, there is a risk that one side (insulating layer 31 side) on which semiconductor laser element 40 is mounted may go up, while the other side (insulating layer 32 side) may go down. In the present modification, a spacer is provided opposite the semiconductor laser element 40 on the lower surface of electrode block 60 (260). The spacer may be made of a comparatively hard insulating material, or may be formed by making electrode block 60 (260) have a protruding lower surface and coating the protruding lower surface with an insulating material.

In all the embodiments and modifications, by the use of connection holes 12, 13, 61, and 62, the upper and lower electrode blocks are fixed to each other with insulating screw 90, electrically conductive screw 91, and insulating member 92. However, the upper and lower electrode blocks may be fixed by adhesion using insulating layers 30 and 130, or alternatively, the upper and lower blocks may be fixed using another adhesive.

Furthermore, in all the embodiments and modifications, bumps 50 bite into metal sheet 70 to connect negative electrode 42 (142) to metal layer 80, but, negative electrode 42 (142) and metal layer 80 may be connected to each other by metal sheet 70 only.

In semiconductor laser element 40 and power semiconductor element 140, positive electrode 41 (141) may be on the upper side thereof and negative electrode 42 (142) may be on the lower side thereof.

INDUSTRIAL APPLICABILITY

According to the present disclosure, the metal layer and the metal sheet are provided between the bumps and the second electrode block, so that a stress caused by the difference in the coefficient of thermal expansion between the semiconductor element and the second electrode block is relaxed, and an electrical connection between the semiconductor element and the second electrode block can be stably ensured. Hence, the semiconductor device according to the present disclosure is industrially useful as a semiconductor device through which a large electric current flows.

REFERENCE MARKS IN THE DRAWINGS 1, 3 semiconductor laser device
2, 4 power semiconductor device
10, 60, 110, 160, 210, 260, 310, 360 electrode block
11, 111, 261, 361 recess
12, 13, 61, 62 connection hole
14, 63 terminal hole
20 submount
30, 31, 32, 130 insulating layer
40 semiconductor laser element
41, 141 positive electrode
42, 142 negative electrode
50 bump
70 metal sheet
80 metal layer
90 insulating screw
91 electrically conductive screw
92 insulating member
140 power semiconductor element
900 semiconductor laser device
901 heat sink
902 submount
903 LD bar
904 insulating layer
905 bump
906 electrode

The invention claimed is:

1. A semiconductor device, comprising:
a first electrode block being electrically conductive;
a submount being electrically conductive, provided in a first region of an upper surface of the first electrode block, and electrically connected to the first electrode block;
an insulating layer provided in a second region of the upper surface of the first electrode block other than the first region;
a semiconductor element provided on the submount and having a first electrode electrically connected to the submount;
a bump being electrically conductive, provided on an upper surface of a second electrode, opposite the first electrode, of the semiconductor element, and electrically connected to the second electrode;
a second electrode block provided on the bump and the insulating layer and electrically conductive;
an electrically conductive metal layer; and
an electrically conductive metal sheet provided between the electrically conductive metal layer and the bump,
wherein a third region of a lower surface of the second electrode block is electrically connected to the bump via the electrically conductive metal layer and the electrically conductive metal sheet,
a fourth region of the lower surface of the second electrode block is mounted on the insulating layer,
the electrically conductive metal sheet is formed by laminating a plural sheets of metal foil, and
the bump is in physical contact with the electrically conductive metal sheet without chemical bonding.

2. The semiconductor device according to claim 1, wherein the electrically conductive metal layer is joined to the third region.

3. The semiconductor device according to claim 1, wherein the electrically conductive metal layer is grown by plating in the third region.

4. The semiconductor device according to claim 1,
wherein the semiconductor element is a semiconductor laser element that outputs a laser beam,
wherein the first region is an end portion of the upper surface of the first electrode block, and
wherein the second region surrounds in a form of a letter U the first region.

5. The semiconductor device according to claim 1,
wherein the semiconductor element is a power semiconductor element into which a high voltage of not less than 60 V is inputted,
wherein the first region is a central portion of the upper surface of the first electrode block, and
wherein the second region surrounds an entire perimeter of the first region.

6. The semiconductor device according to claim 1,
wherein the upper surface of the first electrode block in the first region is located lower than the upper surface of the first electrode in the second region, and
wherein the lower surface of the second electrode block is flat.

7. The semiconductor device according to claim 1,
wherein the upper surface of the first electrode block is flat, and
wherein the lower surface of the second electrode block in the third region is located higher than the lower surface of the second electrode in the fourth region.

8. The semiconductor device according to claim 1, wherein a main material of the electrically conductive metal sheet is gold.

9. The semiconductor device according to claim 1, wherein a main material of the bump is gold.

10. The semiconductor device according to claim 1, wherein a main material of the electrically conductive metal layer is gold.

11. The semiconductor device according to claim 1, wherein the electrically conductive metal sheet does not directly contact the upper surface of the second electrode.

12. The semiconductor device according to claim 1, wherein
there is an empty space between the electrically conductive metal sheet and the semiconductor element, and
the bump is located in the empty space between the electrically conductive metal sheet does and the semiconductor element.

13. The semiconductor device according to claim 1, wherein
the second region includes a fifth region that surrounds the first region and a sixth region adjacent to the fifth region, and
the insulating layer includes a first insulating layer covering the fifth region and a second insulating layer covering the sixth region.

14. The semiconductor device according to claim 13, wherein a material forming the first insulating layer is harder than a material forming the second insulating layer.

15. The semiconductor device according to claim 13, wherein a material forming the second insulating layer has higher thermal conductivity than a material forming the first insulating layer.

16. The semiconductor device according to claim 13, wherein
a material forming the first insulating layer is harder than a material forming the second insulating layer, and
the material forming the second insulating layer has higher thermal conductivity than the material forming the first insulating layer.

17. The semiconductor device according to claim 13, wherein
the sixth region is apart from the first region with the fifth region therebetween,
a material forming the first insulating layer is harder than a material forming the second insulating layer, and
the material forming the second insulating layer has higher thermal conductivity than the material forming the first insulating layer.

* * * * *